United States Patent
Konishi et al.

(10) Patent No.: US 12,087,661 B2
(45) Date of Patent: Sep. 10, 2024

(54) HEAT CONDUCTING SHEET AND ELECTRONIC DEVICE USING SAME

(71) Applicant: Panasonic Intellectual Property Management Co., Ltd., Osaka (JP)

(72) Inventors: Akihito Konishi, Hokkaido (JP); Norihiro Kawamura, Hokkaido (JP); Youji Shirato, Hokkaido (JP); Naoki Saitou, Hokkaido (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 437 days.

(21) Appl. No.: 17/418,826

(22) PCT Filed: Jan. 15, 2020

(86) PCT No.: PCT/JP2020/000984
§ 371 (c)(1),
(2) Date: Jun. 27, 2021

(87) PCT Pub. No.: WO2020/162117
PCT Pub. Date: Aug. 13, 2020

(65) Prior Publication Data
US 2022/0059431 A1    Feb. 24, 2022

(30) Foreign Application Priority Data

Feb. 8, 2019   (JP) ................................. 2019-021381
Mar. 14, 2019   (JP) ................................. 2019-046614

(51) Int. Cl.
*H05K 7/20*      (2006.01)
*H01L 23/373*    (2006.01)

(52) U.S. Cl.
CPC ............................. *H01L 23/3735* (2013.01)

(58) Field of Classification Search
CPC . H01L 23/3735; H01L 23/373; H01L 23/433; B32B 9/00; C09J 7/38; H05K 7/20
See application file for complete search history.

(56) References Cited

U.S. PATENT DOCUMENTS

2003/0129352 A1*   7/2003   Takahashi ........... H01L 23/3733
                                                                                            428/68
2007/0001292 A1*   1/2007   Ohta .................... H01L 23/3733
                                                                                        257/E23.106
(Continued)

FOREIGN PATENT DOCUMENTS

JP     2008-080672 A    4/2008
JP     2008-192697 A    8/2008
(Continued)

OTHER PUBLICATIONS

International Search Report of PCT application No. PCT/JP2020/000984 dated Apr. 7, 2020.
(Continued)

*Primary Examiner* — S M Sohel Imtiaz
(74) *Attorney, Agent, or Firm* — Rimon P.C.

(57) ABSTRACT

An object of the present disclosure is to provide a heat conducting sheet that can be easily positioned and can absorb unevenness of a heat generating component and a heat radiating component to reduce thermal resistance, and an electronic device using the same. Heat conducting sheet includes rectangular graphite sheet and attachment sheet that covers graphite sheet, graphite sheet being exposed at least two opposite sides. Graphite sheet is exposed from between attachment sheets, a thickness of attachment sheet is made thinner than (T0-T1) where an initial thickness of graphite sheet is T0, and a thickness when a pressure of 100 kPa is applied to the graphite sheet is T1.

5 Claims, 13 Drawing Sheets

(56) References Cited

U.S. PATENT DOCUMENTS

| | | | |
|---|---|---|---|
| 2008/0289810 A1 | 11/2008 | Okabayashi | |
| 2009/0301697 A1* | 12/2009 | Hirose | H01L 23/373 |
| | | | 165/185 |
| 2011/0045300 A1* | 2/2011 | Tamaoki | C01B 32/21 |
| | | | 156/60 |
| 2014/0362532 A1* | 12/2014 | Kubo | F28F 3/00 |
| | | | 165/135 |
| 2017/0053851 A1* | 2/2017 | Kutsumizu | C01B 32/205 |
| 2017/0110385 A1* | 4/2017 | Kawajiri | H01L 23/36 |
| 2017/0156201 A1* | 6/2017 | Nakayama | H05K 1/0204 |
| 2018/0098461 A1 | 4/2018 | Matsuno et al. | |

FOREIGN PATENT DOCUMENTS

| | | |
|---|---|---|
| JP | 2010-010599 | 1/2010 |
| JP | 2016-219527 A | 12/2016 |

OTHER PUBLICATIONS

English Translation of Chinese Office Action dated Dec. 2, 2022 for the related Chinese Patent Application No. 202080011893.3.

\* cited by examiner

HEAT CONDUCTING SHEET AND ELECTRONIC DEVICE USING SAME

FIELD OF THE INVENTION

The present disclosure relates to a heat conducting sheet provided between a heat generating component and a heat radiating component, and an electronic device using the heat conducting sheet.

DESCRIPTION OF THE RELATED ART

In recent years, as performance of electronic devices has improved, an amount of heat generated inside each of the devices has increased, and measures against the heat have become important. For this reason, for example, a thermal interface material (hereinafter referred to as TIM) such as silicone grease is provided between the heat generating component and the heat radiating component to quickly conduct heat. However, when silicone grease is used, when the heat generating component and the heat radiating component repeat expansion and contraction due to heat, a phenomenon called pump-out that the silicone grease is gradually discharged to an outside occurs, and heat conduction easily deteriorates. Therefore, a heat conducting sheet such as a graphite sheet may be used.

As prior art literature information related to the invention of this application, for example, PTL 1 is known.

CITATION LIST

Patent Literature

PTL 1: Unexamined Japanese Patent Publication No. 2010-10599

SUMMARY OF THE INVENTION

However, since the graphite sheet is slippery, there is a problem that it is difficult to place the graphite sheet in an accurate position.

The present disclosure provides a heat conducting sheet that can be easily positioned and can absorb unevenness of a heat generating component and a heat radiating component to reduce thermal resistance, and an electronic device using the heat conducting sheet.

In order to solve the above problems, the invention according to the present disclosure (hereinafter referred to as the present invention) has a configuration below. That is, a heat conducting sheet of the present invention includes a graphite sheet and an attachment sheet. The graphite sheet has a main surface having a rectangular shape. The attachment sheet is provided on the main surface of the graphite sheet. Further, the attachment sheet covers the graphite sheet, the attachment sheet being disposed out from at least two opposite sides of the main surface of the graphite sheet. The main surface of the graphite sheet has a first region covered with the attachment sheet and a second region not covered with the attachment sheet. Further, a thickness of the attachment sheet is made thinner than (T0−T1) where an initial thickness of the graphite sheet is T0, and a thickness of the graphite sheet when a pressure of 100 kPa is applied is T1.

Further, a heat conducting sheet of the present invention includes a graphite sheet, an attachment sheet, a separator, and a protective film. The graphite sheet has a main surface having a rectangular shape and a back surface opposed to the main surface. The attachment sheet is provided on the main surface of the graphite sheet. The attachment sheet covers the graphite sheet, the attachment sheet being disposed out from at least two opposite sides of the main surface of the graphite sheet. The separator is provided on the back surface of the graphite sheet. The protective film is provided on the main surface of the graphite sheet and on the attachment sheet. The main surface of the graphite sheet is an attachment sheet having a first region covered with the attachment sheet and a second region not covered with the attachment sheet. Further, an end portion of the attachment sheet in a portion protruding from the graphite sheet is in contact with the protective film.

According to the heat conducting sheet of the present invention, the heat conducting sheet can be fixed to the heat radiating member or the heat generating component with the attachment sheet in the portion being disposed out from the graphite sheet. At the same time, when a pressure is applied to the heat conducting sheet, the graphite sheet is more easily compressed than the attachment sheet. Therefore, the graphite sheet in the exposed portion can be brought into close contact with the heat radiating member and the heat generating component, so that stable thermal conductivity can be ensured.

DETAILED DESCRIPTION OF THE PREFERRED EMBODIMENTS

Figure 1:
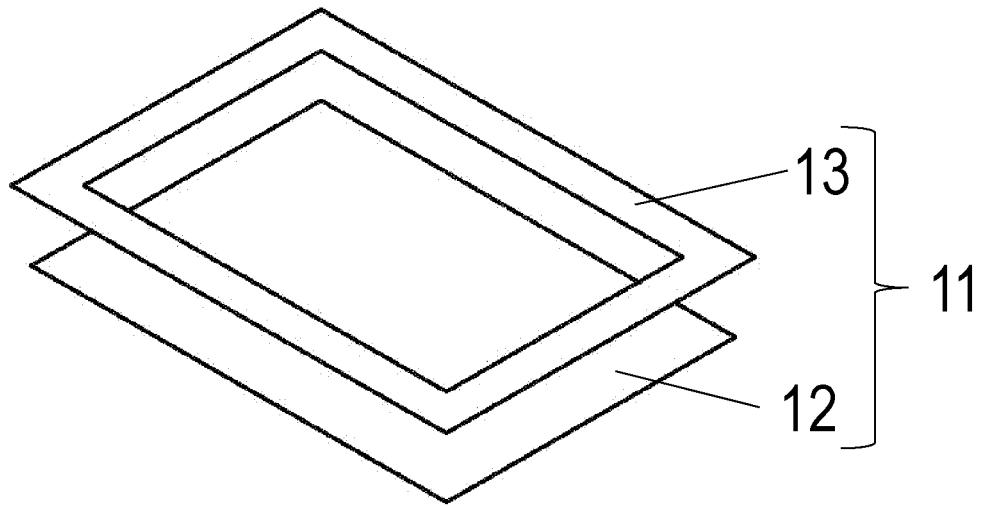
FIG. 1 is an exploded perspective view of a heat conducting sheet in a first exemplary embodiment of this disclosure.

A heat conducting sheet of a first aspect of the present disclosure includes a graphite sheet and an attachment sheet. The graphite sheet has a main surface having a rectangular shape. The attachment sheet is provided on the main surface of the graphite sheet. Further, the attachment sheet covers the graphite sheet, the attachment sheet being disposed out from at least two opposite sides of the main surface of the graphite sheet. The main surface of the graphite sheet has a first region not covered with the attachment sheet and a second region covered with the attachment sheet. Further, a thickness of the attachment sheet is made thinner than (T0 □ T1) where an initial thickness of the graphite sheet is T0, and a thickness of the graphite sheet when a pressure of 100 kPa is applied is T1.

Further, a heat conducting sheet of a second aspect of the present disclosure includes a graphite sheet, an attachment sheet, a separator, and a protective film. The graphite sheet has a rectangular main surface and a back surface on an opposite side of the main surface. The attachment sheet is provided on the main surface of the graphite sheet. The attachment sheet covers the graphite sheet, the attachment sheet being disposed out from at least two opposite sides of the main surface of the graphite sheet. The separator is provided on the back surface of the graphite sheet. The protective film is provided on the main surface of the graphite sheet and on the attachment sheet. The main surface of the graphite sheet has a first region not covered with the attachment sheet and a second region covered with the attachment sheet. Further, an end portion of the attachment sheet in a portion being disposed out from the graphite sheet is in contact with the protective film.

With each of the heat conducting sheets of these aspects, it is possible to fix a heat radiating member or a heat generating component with the attachment sheet in the portion being disposed out from the graphite sheet. At the same time, when a pressure is applied to the heat conducting sheet, the graphite sheet is more easily compressed than the attachment sheet. Therefore, the graphite sheet in the exposed portion can be brought into close contact with the heat radiating member and the heat generating component, so that stable thermal conductivity can be ensured.

According to the heat conducting sheet of a third aspect of the present disclosure, in the second aspect, a thickness of the attachment sheet is made thinner than (T0−T1) where an initial thickness of the graphite sheet is T0, and a thickness of the graphite sheet when a pressure of 100 kPa is applied is T1.

According to the heat conducting sheet of a fourth aspect of the present disclosure, in the second aspect, a slightly adhesive layer is provided on a surface of the protective film facing the attachment sheet.

According to the heat conducting sheet of a fifth aspect of the present disclosure, in the second aspect, the separator is provided with a slit that crosses a region where the separator adheres to the portion of the attachment sheet, the portion being disposed out from the graphite sheet.

According to the heat conducting sheet of a sixth aspect of the present disclosure, in the second aspect, the attachment sheet and the separator adhere to each other, and the protective film and the attachment sheet adhere to each other, and an adhesive force between the attachment sheet and the separator is made weaker than an adhesive force between the protective film and the attachment sheet.

The heat conducting sheet of a seventh aspect of the present disclosure, in the second aspect, further includes a spacer between the attachment sheet and the protective film. Moreover, the end portion of the attachment sheet in the portion being disposed out from the graphite sheet is in contact with the protective film with the spacer interposed.

According to the heat conducting sheet of an eighth aspect of the present disclosure, in any one of the first to seventh aspects, the attachment sheet covers an entire outer periphery of the main surface of the graphite sheet.

According to the heat conducting sheet of a ninth aspect of the present disclosure, in any one of the first to seventh aspects, the graphite sheet has a rectangular shape. Two long sides of the graphite sheet are entirely covered with the attachment sheet. Each short side of the graphite sheet has a first portion that is not covered with the attachment sheet and a second portion that is covered with the attachment sheet.

An electronic device of a tenth aspect of the present disclosure includes a heat generating component, a heat radiating member, and the heat conducting sheet according to any one of the first to seventh aspects. In the electronic device, the heat conducting sheet is provided between the heat generating component and the heat radiating member. The heat conducting sheet is pasted to the heat radiating member or the heat generating component by the attachment sheet in the outer peripheral portion of the graphite sheet. Further, the heat conducting sheet is in contact with the heat generating component and the heat radiating member in a state where the graphite sheet in the first region is compressed.

In the electronic device according to an eleventh aspect of the present disclosure, with respect to the electronic device according to the tenth aspect, an upper surface of the heat generating component comes into contact with the attachment sheet, and a terminal is led out from a side surface of the heat generating component. Moreover, a side of the graphite sheet located on a side where the terminal is led out is entirely covered with the attachment sheet.

Hereinafter, the heat conducting sheets in exemplary embodiments of the present disclosure will be described with reference to the drawings. The heat conducting sheets and the electronic devices described below are each a specific example. Numerical values, shapes, materials, constituents, disposition positions and connection forms of the constituents, and the like described in the following exemplary embodiments are illustrative, and are not intended to limit the scope of the present invention. Further, of the constituents in the following exemplary embodiments, the constituents that are not recited in the independent claims representing the most superordinate concept are illustrated herein as optional components.

First Exemplary Embodiment (Heat Conducting Sheet)

Figure 2:
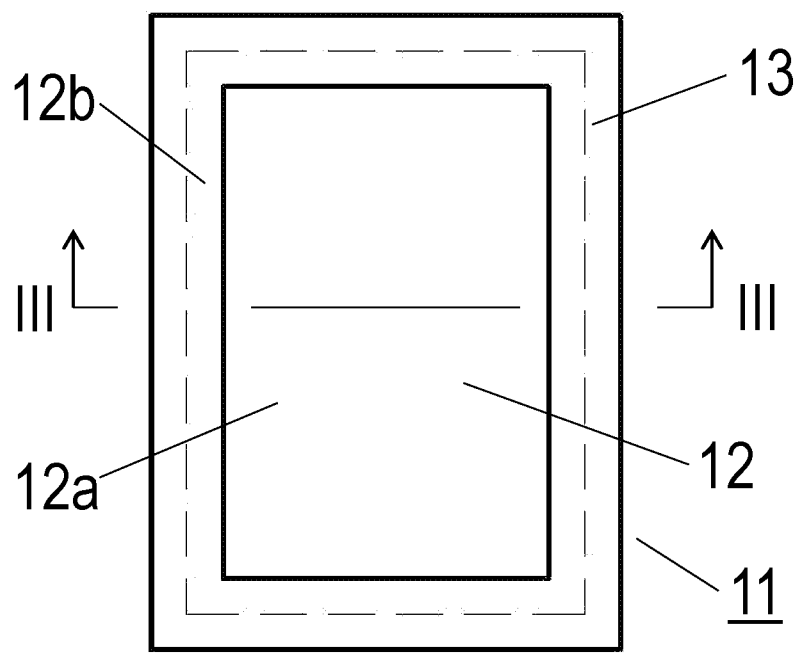
FIG. 2 is a top view of the heat conducting sheet in the same exemplary embodiment.
Figure 3:
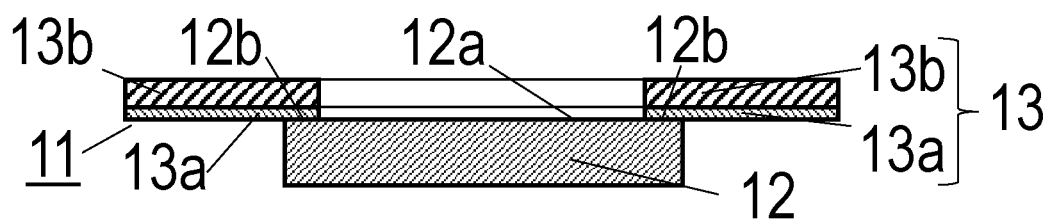
FIG. 3 is a cross-sectional view taken along line III-III shown in FIG. 2 of the heat conducting sheet in the same exemplary embodiment.

FIG. 1 is an exploded perspective view of heat conducting sheet 11 in a first exemplary embodiment of the present disclosure, FIG. 2 is a top view of heat conducting sheet 11, and FIG. 3 is a cross sectional view taken along line III-III of heat conducting sheet 11. As graphite sheet 12, a pyrolytic graphite sheet having a rectangular size of about 60 mm in length and about 90 mm in width (about 60 mm×90 mm), and having a thickness of about 100 μm is used. It is desirable to use graphite sheet 12 having high compressibility, and a compressibility ratio when a pressure of 100 kPa is applied is about 35%. Here, the compressibility ratio is a percentage indication of a value of (T0-T1)/T0, where an initial thickness is T0 and a thickness in a state where a pressure of 100 kPa is applied is T1. In the present exemplary embodiment, the thickness of graphite sheet 12 is about 100 μm before the pressure of 100 kPa is applied, and the thickness of graphite sheet 12 in the state where the pressure of 100 kPa is applied is about 65 μm.

As shown in FIG. 3, attachment sheet 13 is provided on one surface (main surface) of graphite sheet 12. Attachment sheet 13 has a width of about 10 mm along an outer periphery of graphite sheet 12, and is provided to protrude by about 5 mm from an outer peripheral portion of graphite sheet 12. Attachment sheet 13 is a sheet for attaching graphite sheet 12 to an electronic component or the like. Attachment sheet 13 is made of base material 13b and adhesive layer 13a, and adhesive layer 13a is provided on a surface of the base material 13b facing graphite sheet 12. A thickness of attachment sheet 13 including adhesive layer 13a is about 10 μm. Therefore, the thickness of attachment sheet 13 is smaller than that of (T0-T1). Further, in a central portion of graphite sheet 12 sandwiched between attachment sheets 13, graphite sheet 12 is in an exposed state. A region on the main surface of graphite sheet 12 where attachment sheet 13 is not provided is referred to as first region 12a. Further, a region on the main surface of graphite sheet 12 where attachment sheet 13 is provided is referred to as second region 12b.

(First Modification)

Figure 4:
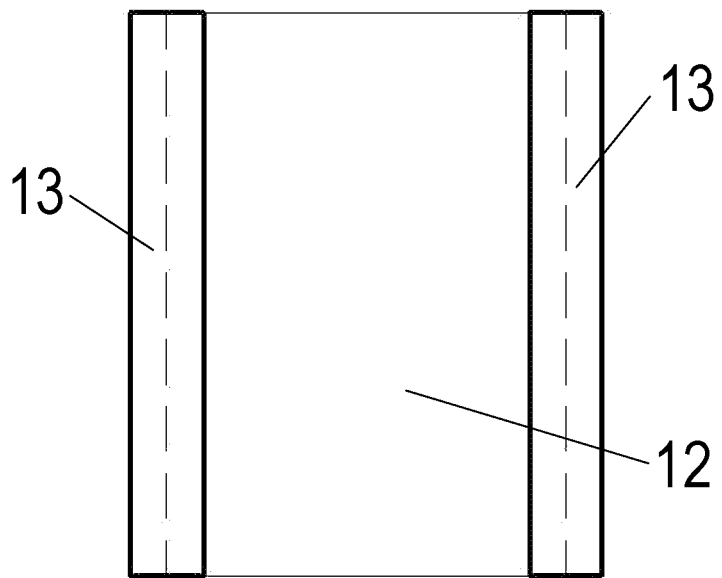
FIG. 4 is a top view of a heat conducting sheet according to a first modification of the same exemplary embodiment.

FIG. 4 shows a top view of heat conducting sheet 11 according to a first modification of the first exemplary embodiment. As shown in FIG. 4, only two long sides of graphite sheet 12 may be entirely covered with attachment sheet 13.

(Second Modification)

Figure 5:
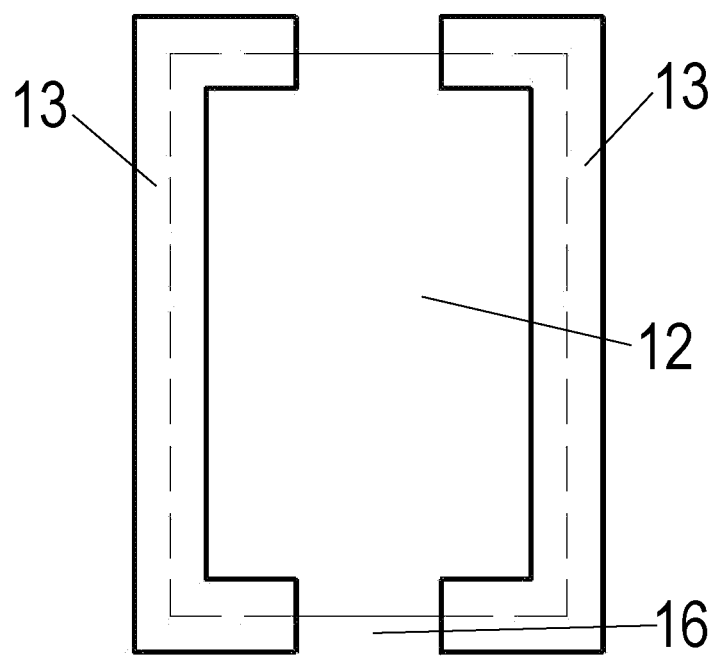
FIG. 5 is a top view of a heat conducting sheet according to a second modification of the same exemplary embodiment.

FIG. 5 shows a top view of heat conducting sheet 11 according to a second modification of the first exemplary embodiment. As shown in FIG. 5, almost the entire outer periphery of graphite sheet 12 may be covered with attachment sheet 13, and cutout portions 16 are provided on short sides. That is, each of the short sides of graphite sheet 12 may have a first portion not covered by attachment sheet 13 and second portions covered with attachment sheet 13. Performing the foregoing can prevent air from staying between heat generating component 14 or heat radiating member 15 and heat conducting sheet 11, and increasing thermal resistance.

(Electronic Device)

Figure 6:
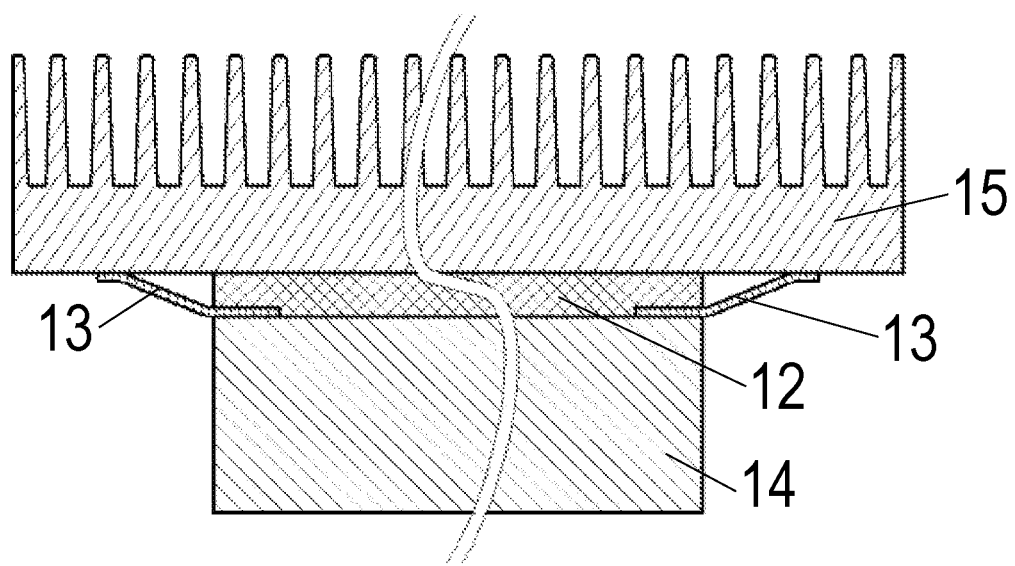
FIG. 6 is a cross-sectional view of an electronic device using the heat conducting sheet in the same exemplary embodiment.

FIG. 6 is a cross-sectional view of an electronic device using heat conducting sheet 11 according to the first exemplary embodiment. As electronic devices, power transistors such as insulated gate bipolar transistors (IGBTs) can be exemplified. They are used as components for a base station, motor driving, and in-vehicle application. Heat conducting sheet 11 is pasted to heat radiating member 15 by attachment sheet 13 being disposed out from the outer peripheral portion of graphite sheet 12, and heat generating component 14 is pressed against heat conducting sheet 11 at a pressure of about 200 kPa to be fixed. While being compressed by this pressure of about 200 kPa, graphite sheet 12 is deformed and brought into close contact with heat generating component 14 and heat radiating member 15 in accordance with unevenness. Therefore, the thermal resistance between heat generating component 14 and heat radiating member 15 becomes small, and heat radiation efficiency of the electronic device is improved.

(Method for Manufacturing Electronic Device Through use of Heat Conducting Sheet 11)

Figure 7A:
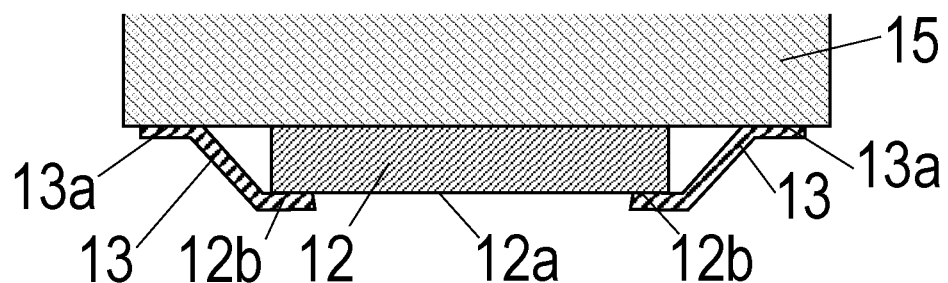
FIG. 7A is a cross-sectional view showing a process when the heat conducting sheet in the same exemplary embodiment is attached to the electronic device.
Figure 7B:
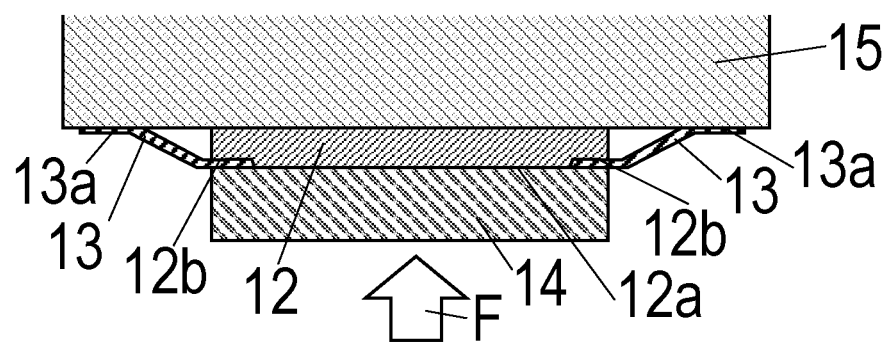
FIG. 7B is a cross-sectional view showing the process when the heat conducting sheet in the same exemplary embodiment is attached to the electronic device.

Next, a method for manufacturing an electronic device through the use of heat conducting sheet 11 will be described with reference to FIGS. 7A, 7B. FIGS. 7A, 7B are specifically cross-sectional views showing a process when heat conducting sheet 11 is attached to the electronic device.

First, as shown in FIG. 7A, heat conducting sheet 11 is pasted to heat radiating member 15 such as a heat sink. Here, attachment sheet 13 protrudes from the periphery of graphite sheet 12. Therefore, heat conducting sheet 11 can be easily disposed at an accurate position by attachment sheet 13. Next, as shown in FIG. 7B, heat generating component 14 is attached to the exposed surface of graphite sheet 12. Then, predetermined pressure F is applied from heat generating component 14 to compress graphite sheet 12. It is desirable that pressure F at this time is about 100 kPa to 300 kPa. Even if a region including attachment sheet 13 is compressed at the same time, by making the thickness of attachment sheet 13 sufficiently thin, a sufficient pressure is applied to exposed graphite sheet 12 as well, so that graphite sheet 12 is compressed. Therefore, even if heat radiating member 15 and heat generating component 14 have unevenness, the exposed portion of graphite sheet 12 can be brought into close contact with heat radiating member 15 and heat generating component 14, so that the thermal resistance can be reduced.

In particular, heat conducting sheet 11 is excellent in that the thickness of attachment sheet 13 is smaller than that of (T0-T1). This is because when a pressure is applied to graphite sheet 12, first region 12a becomes almost the same height as a height of a surface of attachment sheet 13. Therefore, graphite sheet 12 in the exposed portion can be brought into close contact with heat radiating member 15 and heat generating component 14.

Further, causing attachment sheet 13 to cover the entire outer periphery of graphite sheet 12 can prevent graphite powder from dropping or scattering from an end portion of graphite sheet 12, so that reliability of the electronic device can be improved.

(First Modification of Electronic Device)

Figure 8:
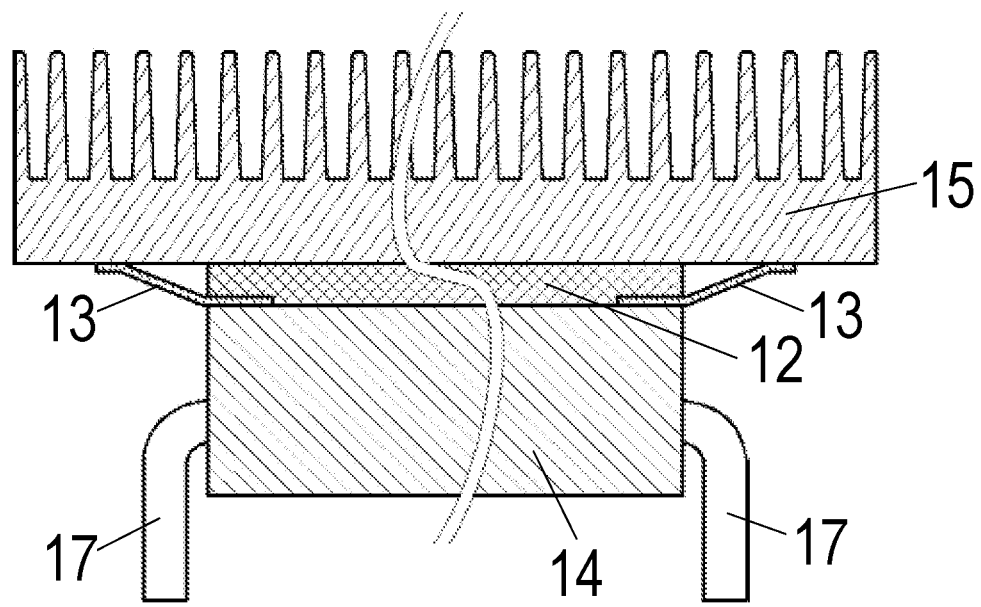
FIG. 8 is a cross-sectional view according to a first modification of the electronic device using the heat conducting sheet in the same exemplary embodiment.
Figure 9:
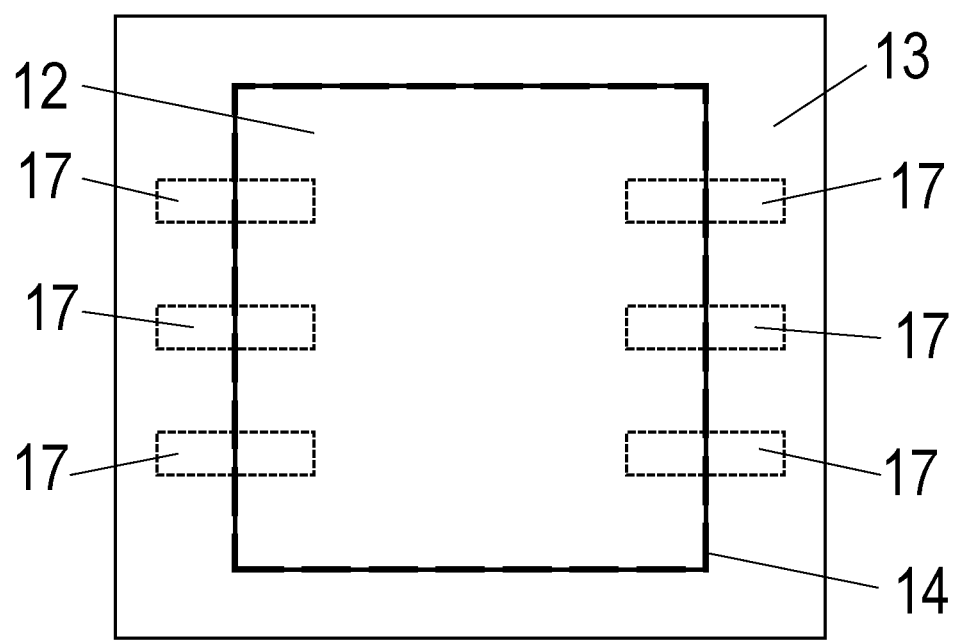
FIG. 9 is a top view according to the first modification of the electronic device using the heat conducting sheet in the same exemplary embodiment.

FIG. 8 shows a cross-sectional view of a first modification of the electronic device using the heat conducting sheet in the first exemplary embodiment. Further, FIG. 9 shows a top view of the modification of the electronic device. In FIG. 9, heat radiating member 15 is omitted for convenience of description. When terminals 17 of heat generating component 14 are led out from side surfaces as shown in FIG. 8, it is desirable that sides of graphite sheet 12 located on the sides where terminals 17 are led out are entirely covered with attachment sheet 13 as shown in FIG. 9. This can prevent adverse effects due to dropping or scattering of graphite powder from the end portion of graphite sheet 12 to terminals 17.

(Second Modification of Electronic Device)

Figure 10:
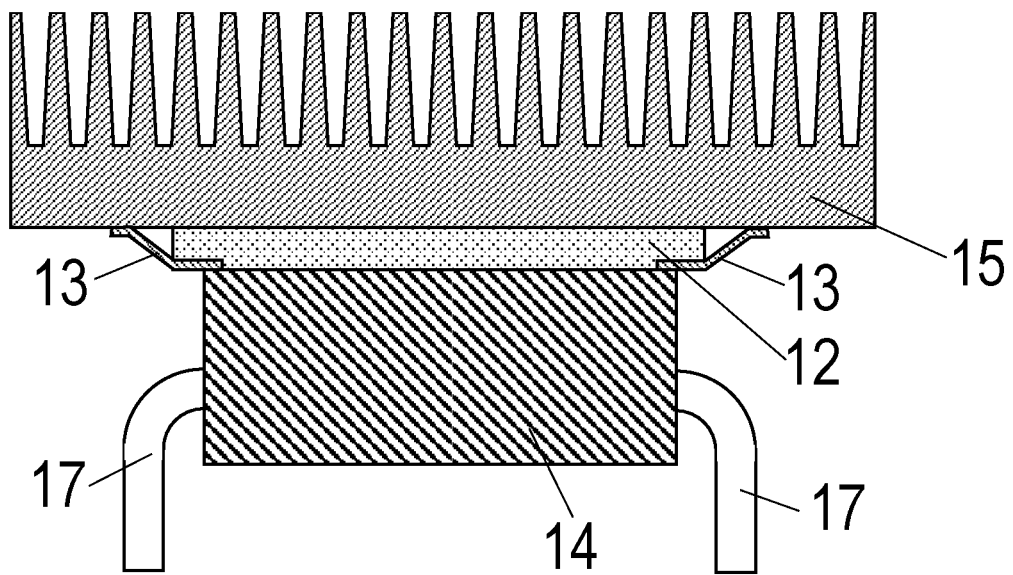
FIG. 10 is a cross-sectional view according to a second modification of the electronic device using the heat conducting sheet in the same exemplary embodiment.
Figure 11:
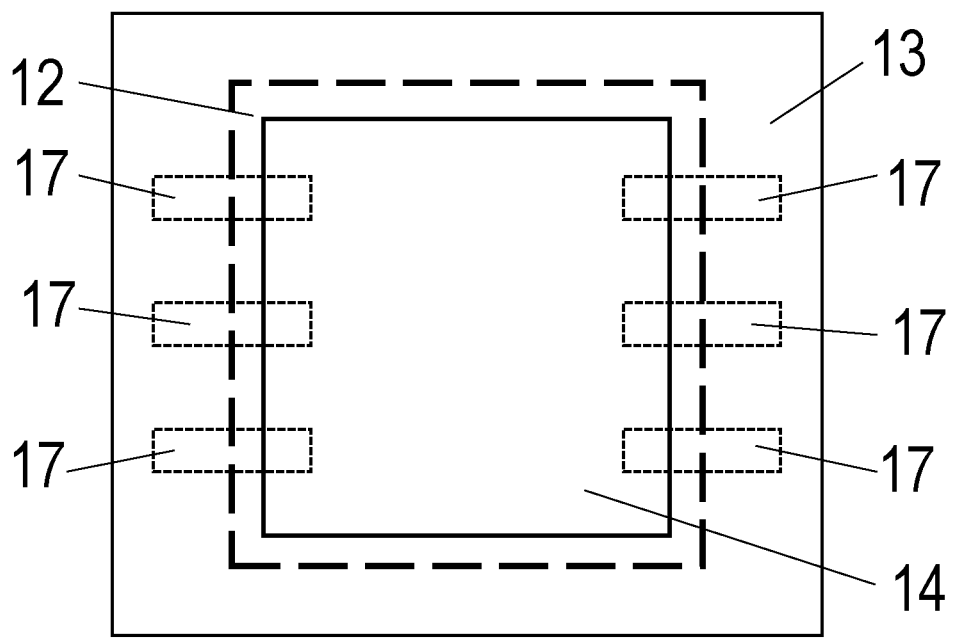
FIG. 11 is a top view according to the second modification of the electronic device using the heat conducting sheet in the same exemplary embodiment.

FIG. 10 shows a cross-sectional view of a second modification of the electronic device using the heat conducting sheet in the first exemplary embodiment. Further, FIG. 11 shows a top view of the modification of the electronic device. In FIG. 11, heat radiating member 15 is omitted for convenience of description.

The electronic device according to this second modification is a case where an area of an upper surface of graphite sheet 12 is larger than an area of an upper surface of heat generating component 14. Other configurations are the same as in the case of the first modification of the electronic device. In the above-described configuration, it is also possible to prevent adverse effects due to dropping or scattering of graphite powder from the end portion of graphite sheet 12 to terminals 17.

(Third Modification of Electronic Device)

Figure 12:
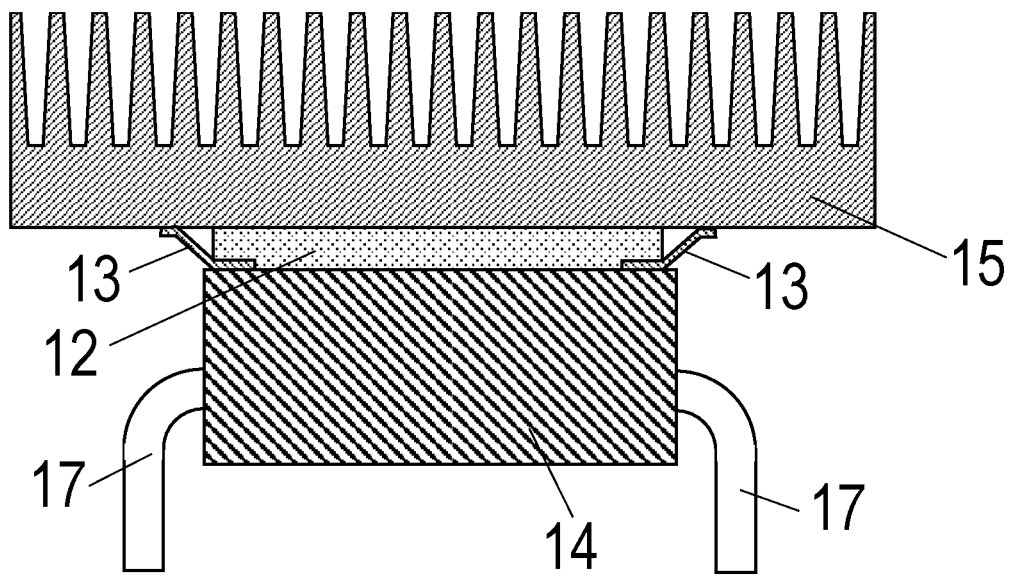
FIG. 12 is a cross-sectional view according to a third modification of the electronic device using the heat conducting sheet in the same exemplary embodiment.
Figure 13:
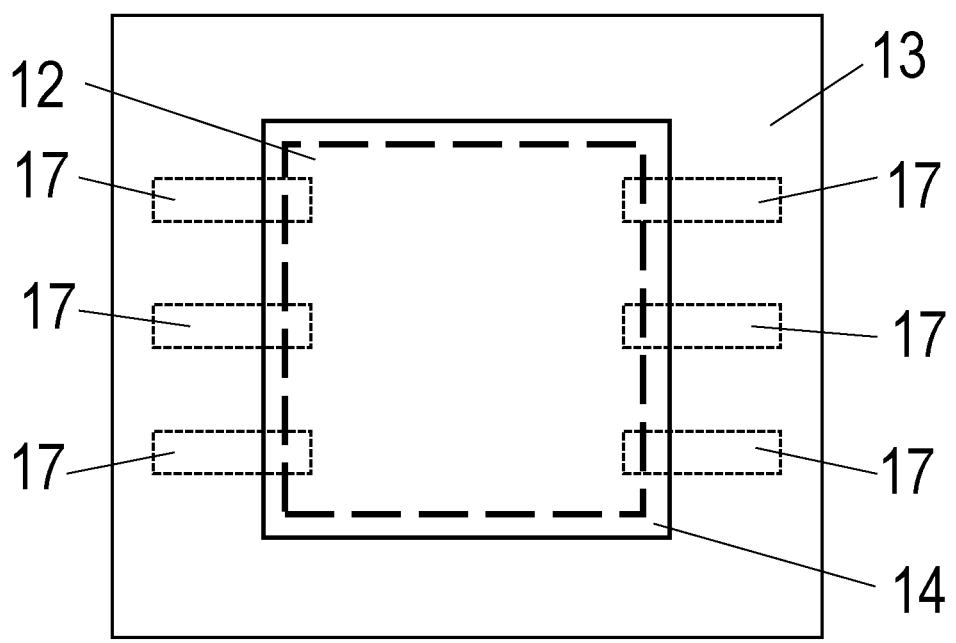
FIG. 13 is a top view of the third modification of the electronic device using the heat conducting sheet in the same exemplary embodiment.

FIG. 12 shows a cross-sectional view of a third modification of the electronic device using the heat conducting sheet in the first exemplary embodiment. Further, FIG. 13 shows a top view of the modification of the electronic device. In FIG. 13, heat radiating member 15 is omitted for convenience of description.

The electronic device according to this third modification is a case where the area of an upper surface of graphite sheet 12 is smaller than the area of the upper surface of heat generating component 14. Other configurations are the same as in the case of the first modification of the electronic device. In the above-described configuration, it is also possible to prevent adverse effects due to dropping or scattering of graphite powder from the end portion of graphite sheet 12 to terminals 17.

Second Exemplary Embodiment (Heat Conducting Sheet)

Figure 14:
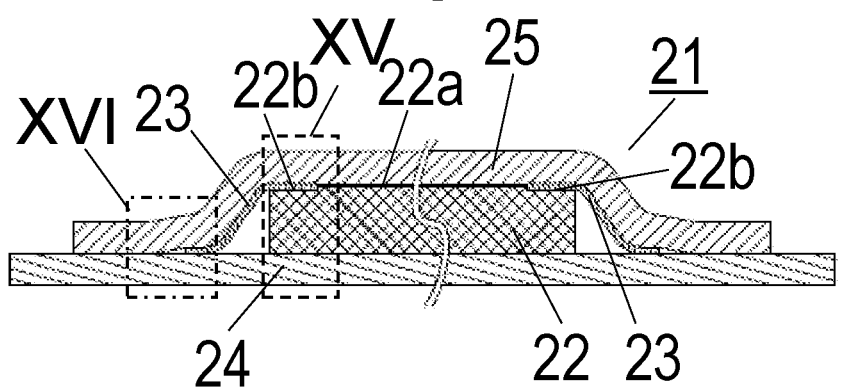
FIG. 14 is a cross-sectional view of a heat conducting sheet in a second exemplary embodiment of this disclosure.
Figure 15:
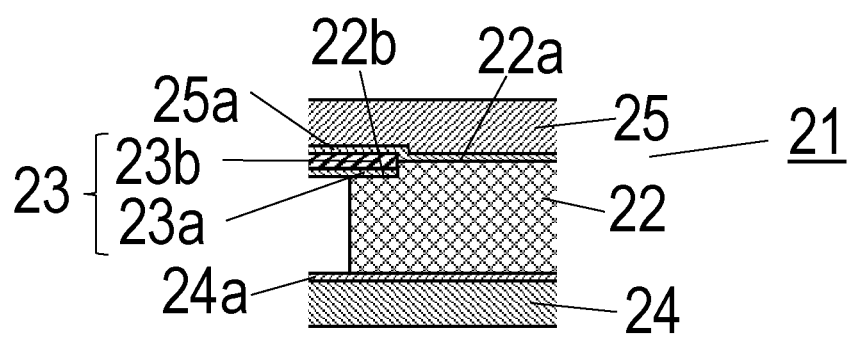
FIG. 15 is an enlarged cross-sectional view in region XV shown in FIG. 14 of the heat conducting sheet in the same exemplary embodiment.
Figure 16:
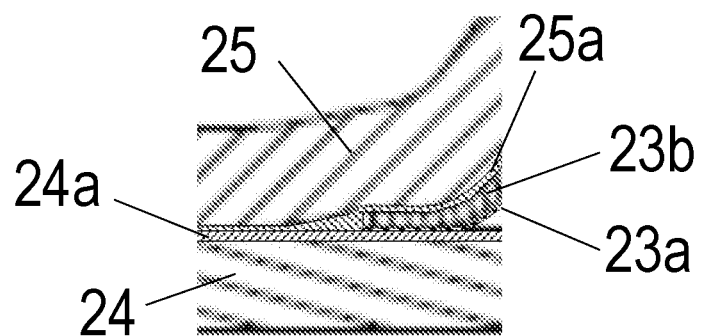
FIG. 16 is an enlarged cross-sectional view in region XVI shown in FIG. 14 of the heat conducting sheet in the same exemplary embodiment.
Figure 17:
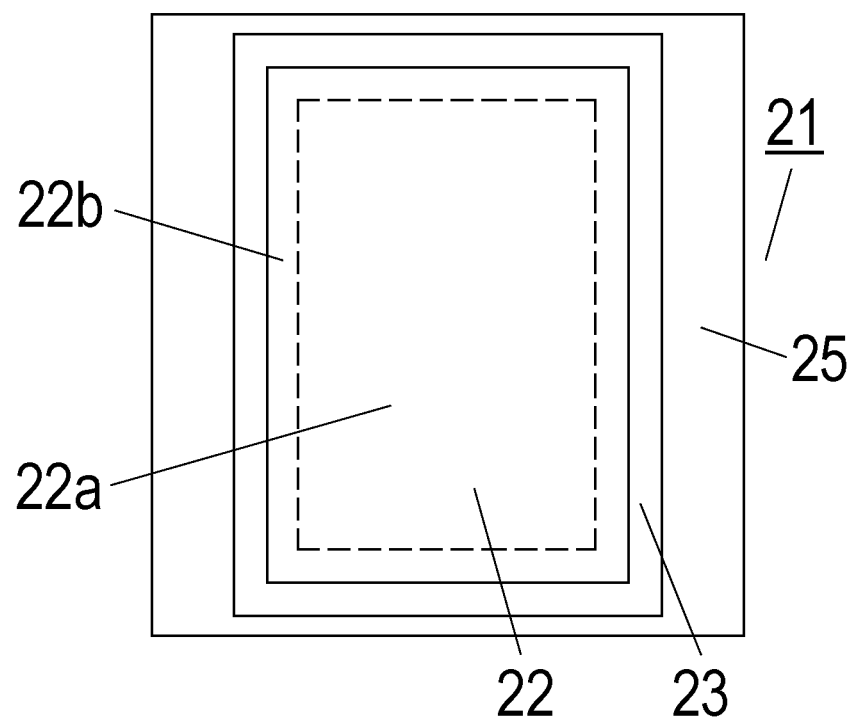
FIG. 17 is a bottom view of the heat conducting sheet in the same exemplary embodiment.

FIG. 14 is a cross-sectional view of heat conducting sheet 21 according to a second exemplary embodiment of the present disclosure, FIG. 15 is an enlarged cross-sectional view of heat conducting sheet 21 in region XV in FIG. 14, FIG. 16 is an enlarged cross-sectional view of heat conducting sheet 21 in region XVI in FIG. 14, and FIG. 17 is a bottom view of heat conducting sheet 21. FIG. 17 is a bottom view in a state where separator 24 is removed from heat conducting sheet 21.

As graphite sheet 22, a pyrolytic graphite sheet having a rectangular size of about 60 mm×90 mm, and having a thickness of about 100 μm is used. It is desirable to use graphite sheet 22 having high compressibility, and a compressibility ratio when a pressure of 100 kPa is applied is about 35%. Here, the compressibility ratio is a percentage indication of a value of (T0-T1)/T0, where an initial thickness is T0 and a thickness in a state where a pressure of 100 kPa is applied is T1.

FIG. 15 is an enlarged cross-sectional view in region XV near the end portion of graphite sheet 22 in FIG. 14. Further, FIG. 16 is an enlarged cross-sectional view in region XVI near an end portion of attachment sheet 23 in FIG. 14.

Attachment sheet 23 is provided on one surface (main surface) of graphite sheet 22. Attachment sheet 23 has a width of about 10 mm along an outer periphery of graphite sheet 22, and is provided to protrude by about 5 mm from an outer peripheral portion of graphite sheet 22. In attachment sheet 23, polyethylene terephthalate (hereinafter referred to as PET) is used for base material 23b, and adhesive layer 23a made of acrylic is provided on a surface of base material 23b facing graphite sheet 22. A thickness of attachment sheet 23 including adhesive layer 23a is about 10 μm. Therefore, the thickness of attachment sheet 23 is smaller than (T0-T1). Further, in a central portion of graphite sheet 22 sandwiched between attachment sheets 23, graphite sheet 22 is in an exposed state. A region on the main surface of graphite sheet 22 where attachment sheet 23 is not provided is referred to as first region 22a. Further, a region on the main surface of graphite sheet 22 where attachment sheet 23 is provided is referred to as second region 22b.

Separator 24 having a thickness of about 75 μm is provided on a surface (back surface) side (a lower surface of graphite sheet 22 in FIGS. 14, 15) where the entire surface of graphite sheet 22 is exposed. Mold release material 24a made of a silicone resin is provided on a surface of separator 24 facing graphite sheet 22. Therefore, attachment sheet 23 at portions being disposed out from graphite sheet 22 adheres to separator 24 with a weak force by mold release material 24a.

Further, protective film 25 having a thickness of about 50 μm is provided on the surface (main surface) side (upper surface of graphite sheet 22 in FIGS. 14, 15) where attachment sheet 23 is provided. Slightly adhesive layer 25a made of silicone is provided on a surface of protective film 25 facing attachment sheet 23. Further, an end portion of attachment sheet 23 in a portion being disposed out from graphite sheet 22 adheres to protective film 25 by slightly adhesive layer 25a. Here, slightly adhesive layer 25a means an adhesive layer that has an appropriate adhesiveness to a target material and leaves no adhesive on the target material when the adhesive layer is peeled off.

With the above configuration, since adhesive layer 23a made of acrylic hardly adheres to mold release material 24a made of silicone resin, an adhesive force between attachment sheet 23 and separator 24 is weaker than an adhesive force between protective film 25 and attachment sheet 23.

Heat conducting sheet 21 is pasted to a heat radiating member such as a heat sink. First, separator 24 is peeled off from heat conducting sheet 21. Since the adhesive force between attachment sheet 23 and separator 24 is weaker than the adhesive force between protective film 25 and attachment sheet 23, only separator 24 can be peeled off.

Since attachment sheet 23 in the portion being disposed out from graphite sheet 22 is thin, it becomes difficult to maintain a shape of the portion. In the present exemplary embodiment, since the end portion of attachment sheet 23 in the portion being disposed out from graphite sheet 22 is caused to adhere to protective film 25, the shape can be maintained. Since attachment sheet 23 can be pasted to the heat radiating member in a state of being fixed to protective film 25, attachment sheet 23 can be easily disposed at an accurate position. After that, protective film 25 is peeled off. By setting the adhesive force between protective film 25 and attachment sheet 23 to be weaker than the adhesive force between attachment sheet 23 and the heat radiating member, protective film 25 can be easily peeled off.

Next, a heat generating component is attached on the exposed surface of graphite sheet 22 to compress the graphite sheet by applying a predetermined pressure. It is desirable that the pressure at this time is about 100 kPa to 300 kPa. Even if the region including attachment sheet 23 is compressed at the same time, by making the thickness of attachment sheet 23 sufficiently thin, a sufficient pressure is also applied to exposed graphite sheet 22, so that graphite sheet 22 is compressed. Therefore, even if the heat radiating member and the heat generating component have unevenness, graphite sheet 22 in the exposed portion can be brought into close contact with the heat radiating member and the heat generating component, and the thermal resistance can be reduced.

Further, by causing attachment sheet 23 to cover the entire outer periphery of the graphite sheet, it is possible to prevent the graphite powder from dropping or scattering from an end portion of graphite sheet 22, and reliability of the electronic device is improved.

(First Modification)

Figure 18:
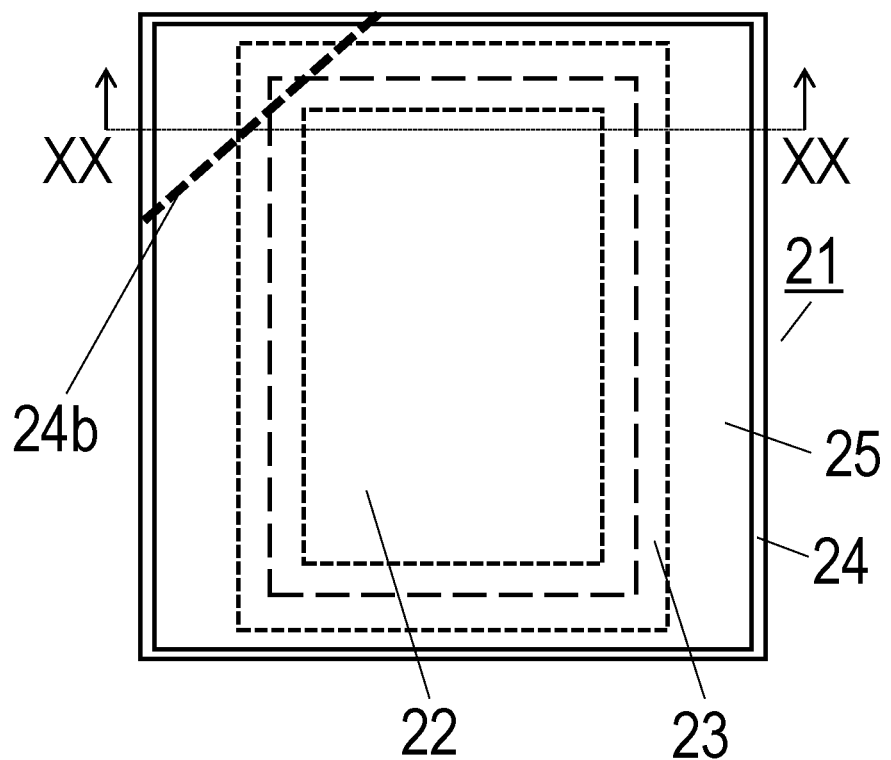
FIG. 18 is a top view of a heat conducting sheet of a first modification in the same exemplary embodiment.
Figure 19:
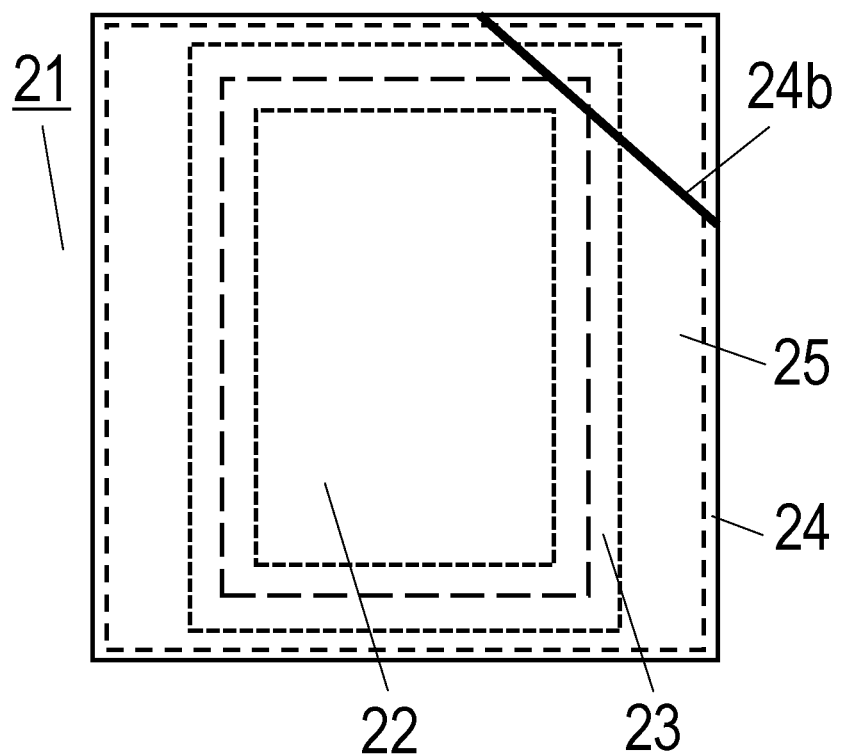
FIG. 19 is a bottom view of the heat conducting sheet of the first modification in the same exemplary embodiment.
Figure 20:
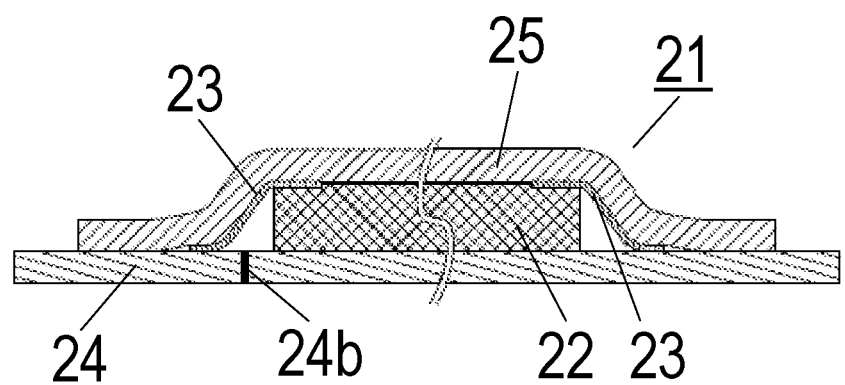
FIG. 20 is a cross-sectional view along XX-XX shown in FIG. 18 of the heat conducting sheet of the first modification in the same exemplary embodiment.

Heat conducting sheet 21 of a first modification according to the second exemplary embodiment of the present disclosure will be described with reference to FIGS. 18 to 20. Heat conducting sheet 21 is provided with slit line 24b on separator 24. FIG. 18 is a top view of heat conducting sheet 21 as viewed from an upper side of protective film 25. FIG. 19 is a bottom view of heat conducting sheet 21 as viewed from a lower side of separator 24. FIG. 20 is a cross-sectional view of heat conducting sheet 21 when heat conducting sheet 21 is cut by line segment XX-XX in FIG. 18.

Separator 24 is provided with slit line 24b that crosses a region where separator 24 adheres to attachment sheet 23 being disposed out from graphite sheet 22, and is connected from one side to another side of separator 24. Slit line 24b is provided by making a cutout in separator 24. That is, slit line 24b is a groove (slit) having a very narrow width, as compared with the thickness of separator 24, or a cutout that reaches from a front surface to a back surface of separator 24. Forming slit line 24b in separator 24 makes it easier to peel off separator 24 from heat conducting sheet 21.

(Second Modification)

Figure 21:
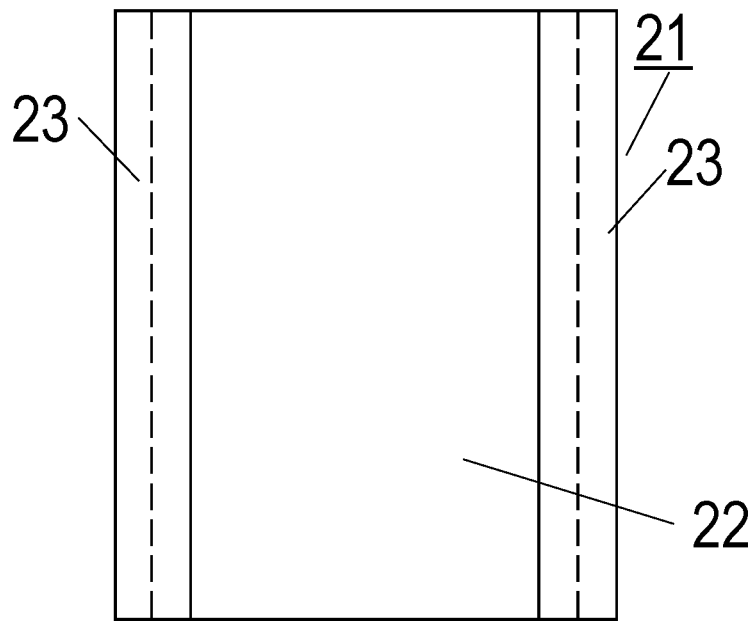
FIG. 21 is a top view of a heat conducting sheet of a second modification in the same exemplary embodiment.

FIG. 21 shows a top view of heat conducting sheet 21 of a second modification according to the second exemplary embodiment of the present disclosure. FIG. 21 is a top view in a state where separator 24 and protective film 25 are removed from heat conducting sheet 21. As shown in FIG. 21, only two long sides of graphite sheet 22 may be covered with attachment sheet 23.

(Third Modification)

Figure 22:
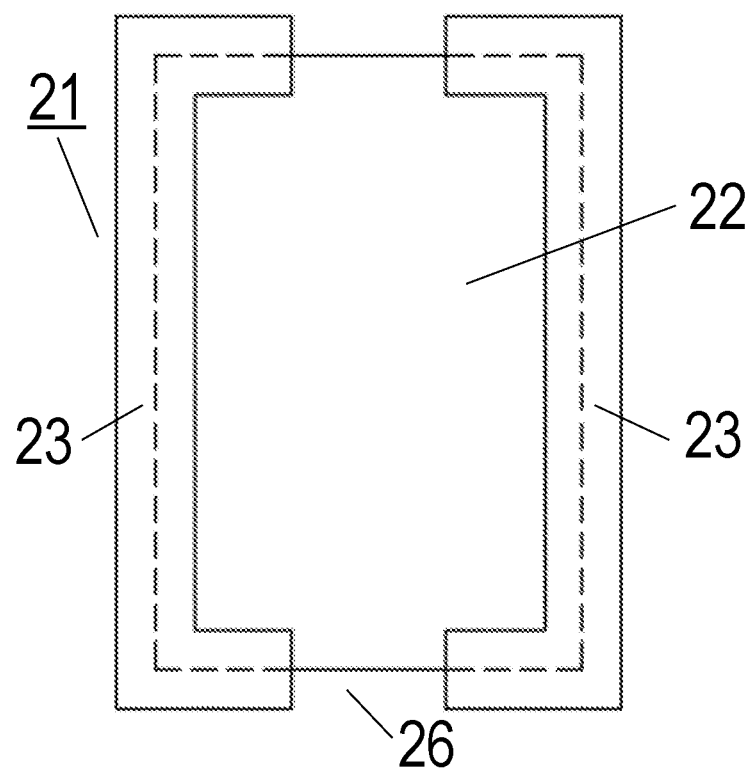
FIG. 22 is a top view of a heat conducting sheet of a third modification in the same exemplary embodiment.

FIG. 22 shows a top view of heat conducting sheet 21 of a third modification according to the second exemplary embodiment of the present disclosure. FIG. 22 is a top view in a state where separator 24 and protective film 25 are removed from heat conducting sheet 21. As shown in FIG. 22, almost the entire outer periphery of graphite sheet 22 may be covered, and cutout portions 26 are provided on short sides. That is, each of the short sides of graphite sheet 22 may have a first portion not covered with attachment sheet 23 and a second portion covered with attachment sheet 23. Performing the foregoing can prevent air from staying between the heat generating component or the heat radiating member and the heat conducting sheet and increasing the thermal resistance.

While in the above-described exemplary embodiment, adhesive layer 23a is not provided to attachment sheet 23 on a side facing protective film 25, and slightly adhesive layer 25a is provided to protective film 25 on a side facing attachment sheet 23, adhesive layers 23a may be provided on both sides of attachment sheet 23 in place of providing slightly adhesive layer 25a to attachment sheet 23 on the side facing protective film 25. In this case, the adhesive force between attachment sheet 23 and separator 24 is made weaker than the adhesive force between protective film 25 and attachment sheet 23, and the adhesive force between protective film 25 and attachment sheet 23 is made weaker than the adhesive force between attachment sheet 23 and the heat radiating member, and this also brings about similar effect.

(Fourth Modification)

Figure 23:
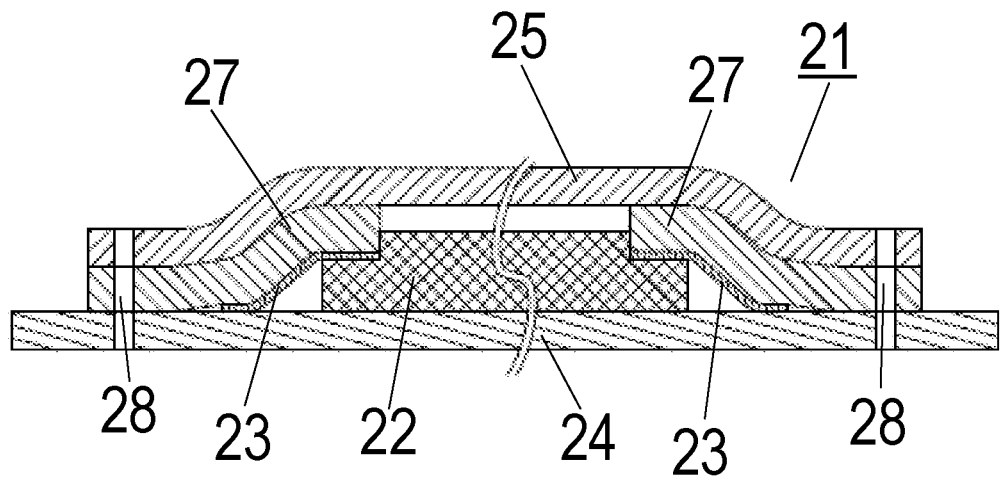
FIG. 23 is a cross-sectional view of a heat conducting sheet of a fourth modification in the same exemplary embodiment.

FIG. 23 shows a cross-sectional view of heat conducting sheet 21 of a fourth modification according to the second exemplary embodiment of the present disclosure. Before attaching graphite sheet 22 to an electronic device or the like, it is desirable to secure a space between graphite sheet 22 and protective film 25 to prevent protective film 25 from coming into contact with the surface of graphite sheet 22 as much as possible. Therefore, as shown in FIG. 23, spacer 27 made of PET having a thickness of about 60 μm may be provided between attachment sheet 23 and protective film 25. In this case, the end portion of attachment sheet 23 in the portion being disposed out from graphite sheet 22 is configured to adhere to protective film 25 with spacer 27 interposed. Furthermore, by making an adhesive force between spacer 27 and protective film 25 stronger than an adhesive force between spacer 27 and attachment sheet 23, spacer 27 and protective film 25 can be peeled off at the same time after pasting to the heat radiating member.

(Fifth Modification)

Figure 24:
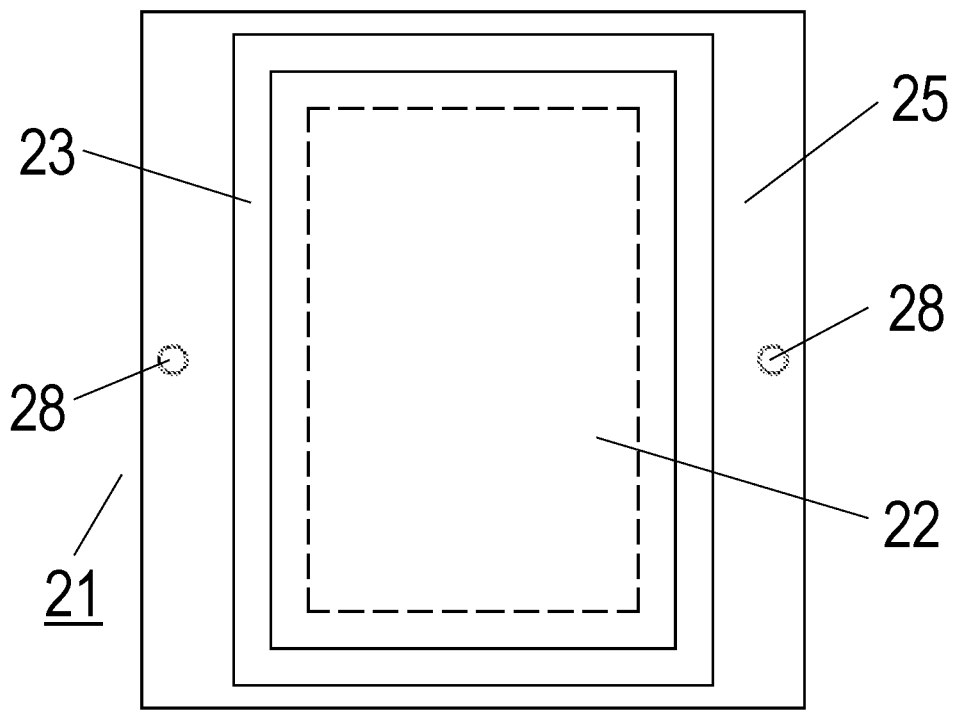
FIG. 24 is a bottom view of a heat conducting sheet of a fifth modification in the same exemplary embodiment.

FIG. 24 shows a bottom view of heat conducting sheet 21 of a fifth modification according to the second exemplary embodiment of the present disclosure. FIG. 24 is a bottom view in a state where separator 24 is removed from heat conducting sheet 21. As shown in FIG. 24, sizes of protective film 25 and separator 24 may be made larger than a region where attachment sheet 23 is provided, and a plurality of through holes 28 may be provided in protective film 25 outside the region where attachment sheet 23 is provided. By providing through holes 28 in protective film 25, through holes 28 can be used for alignment when heat conducting sheet 21 is pasted to the heat radiating member or the heat generating component.

A heat conducting sheet according to the present disclosure can be positioned with high accuracy, and a heat conducting sheet having low thermal resistance can be obtained, so that it is industrially useful.

The invention claimed is:

1. A heat conducting sheet comprising:
    a graphite sheet that has a main surface having a rectangular shape; and
    an attachment sheet that is provided on the main surface of the graphite sheet and covers at least two opposite sides of the main surface, the attachment sheet being disposed out from the two opposite sides of the main surface of the graphite sheet,
    wherein
    the main surface of the graphite sheet has a first region not covered with the attachment sheet, and a second region covered with the attachment sheet, and
    a thickness of the attachment sheet is smaller than (T0−T1) where T0 is an initial thickness of the graphite sheet, and T1 is a thickness of the graphite sheet when a pressure of 100 kPa is applied.

2. The heat conducting sheet according to claim 1, wherein the attachment sheet covers an entire outer periphery of the main surface of the graphite sheet.

3. The heat conducting sheet according to claim 1, wherein the graphite sheet has a rectangular shape, two opposite long sides are entirely covered with the attachment sheet, and each short side has a first portion that is not covered with the attachment sheet and a second portion that is covered with the attachment sheet.

4. An electronic device comprising:
a heat generating component;
a heat radiating member; and
the heat conducting sheet according to claim 1,
wherein
the heat conducting sheet is provided between the heat generating component and the heat radiating member,
the heat conducting sheet is pasted to the heat radiating member or the heat generating component by the attachment sheet, and
the heat conducting sheet is in contact with the heat generating component and the heat radiating member in a state where the first region of the graphite sheet is compressed.

5. The electronic device according to claim 4, wherein
an upper surface of the heat generating component is in contact with the attachment sheet,
a terminal is led out from a side surface of the heat generating component, and
a side of the graphite sheet is located on the side surface where the terminal is led out, and the side of the graphite sheet is entirely covered with the attachment sheet in a plan view.

* * * * *